United States Patent
Kueny

(10) Patent No.: US 7,020,837 B1
(45) Date of Patent: Mar. 28, 2006

(54) METHOD FOR THE EFFICIENT COMPRESSION OF GRAPHIC CONTENT IN COMPOSITE PDF FILES

(76) Inventor: Todd Kueny, 2423 Butler Logan Rd., Tarentum, PA (US) 15084

(*) Notice: Subject to any disclaimer, the term of this patent is extended or adjusted under 35 U.S.C. 154(b) by 696 days.

(21) Appl. No.: 09/683,183

(22) Filed: Nov. 29, 2001

Related U.S. Application Data

(60) Provisional application No. 60/253,812, filed on Nov. 29, 2000.

(51) Int. Cl.
  *G06F 17/18* (2006.01)
  *G06F 17/30* (2006.01)

(52) U.S. Cl. ............... 715/513; 715/500; 715/500.1; 715/530; 715/539

(58) Field of Classification Search ........... 715/500, 715/500.1, 513, 530, 539, 911
See application file for complete search history.

(56) References Cited

U.S. PATENT DOCUMENTS

| | | | |
|---|---|---|---|
| 5,781,785 A | 7/1998 | Rowe et al. | |
| 5,832,530 A | 11/1998 | Paknad et al. | |
| 5,860,073 A * | 1/1999 | Ferrel et al. | 715/522 |
| 6,049,390 A | 4/2000 | Notredame et al. | |
| 6,105,021 A | 8/2000 | Berstis | |
| 6,134,018 A | 10/2000 | Dziesietnik et al. | |
| 6,199,082 B1 * | 3/2001 | Ferrel et al. | 715/522 |
| 6,230,173 B1 * | 5/2001 | Ferrel et al. | 715/513 |
| 6,327,050 B1 | 12/2001 | Motamed et al. | |
| 6,385,595 B1 | 5/2002 | Kolling et al. | |
| 6,476,833 B1 * | 11/2002 | Moshfeghi | 715/854 |
| 6,547,831 B1 * | 4/2003 | Kueny | 715/522 |
| 6,604,105 B1 * | 8/2003 | Roth | 707/100 |
| 6,635,089 B1 * | 10/2003 | Burkett et al. | 715/513 |
| 6,720,985 B1 * | 4/2004 | Silverbrook et al. | 715/863 |
| 6,801,673 B1 * | 10/2004 | Chao et al. | 382/282 |
| 2002/0049702 A1 * | 4/2002 | Aizikowitz et al. | 707/1 |
| 2002/0067502 A1 * | 6/2002 | Hansen | 358/1.15 |

OTHER PUBLICATIONS

Think121.com, pdfExpress, Oct. 9, 2000, www.think121.com, pp. 1-65, <http://web.archive.org/web/20001009161833/http://think121.com/>.*

* cited by examiner

*Primary Examiner*—Stephen Hong
*Assistant Examiner*—Joshua D Campbell
(74) *Attorney, Agent, or Firm*—Buchanan Ingersoll PC; Dennis M. Carleton

(57) ABSTRACT

Disclosed is a method for efficiently creating a compressed PDF file containing multiple composite graphics pages, each of which is composed of a base page and zero or more overlaid and clipped PDF pages, wherein the pages and the graphic elements of each page are stored in static PDF files.

14 Claims, 4 Drawing Sheets

METHOD FOR THE EFFICIENT COMPRESSION OF GRAPHIC CONTENT IN COMPOSITE PDF FILES

RELATED APPLICATIONS

Referenced-Applications

This application claims the benefit of U.S. Provisional Application Ser. No. 60/253,812, filed on Nov. 29, 2000.

FIELD OF THE INVENTION

This invention relates to the use of Adobe® Acrobat® PDF files, and, in particular, discloses a method for creating a compressed form of Adobe® Acrobat® PDF containing composite PDF pages.

BACKGROUND OF INVENTION

The Adobe® company's Acrobat® line of products is designed to allow the creation and viewing of documents in a platform-independent manner. Files can be created or converted to Adobe® Acrobat® Portable Document Format (PDF), which is an open de facto standard for electronic document distribution. PDF is a universal file format that preserves all the fonts, formatting, graphics, and color of the source document, regardless of the application and platform used to create it. Adobe PDF files can be shared, viewed, navigated, and printed exactly as intended. The PDF format and the line of Acrobat® products provides platform transportability for documents.

Each PDF file can describe multiple pages of content. Within each PDF file, the pages are represented in a database having the form of a tree-structure. Each PDF page is accessible from the well-defined root of the tree-structure using a known traversal algorithm. The graphic content of each page, in the form of Cos objects, is represented by one or more terminal nodes in the structure.

In the publishing industry, it is useful to be able to produce composite pages which consist of multiple component graphic objects. It is not uncommon for some of the graphic objects to be variable in nature, such as, for example, the addressee on a form letter. It is also useful and convenient for the component graphic objects to be stored as static PDF files.

FIG. 1 shows a process by which component static PDF files composed of graphical components are composited onto a single page or multiple pages to create a final document. FIGS. 1A & 1B shows an individual composite page. The page contains a letter in which the logo, letter body and signature block can be varied among several choices, most likely depending upon the recipient of the letter. The variable portions of the letter are stored in static PDF files. FIG. 1(C) shows the selection of variable graphic objects for placement of the page based on a variable data stream containing the addressee information. Lastly, FIG. 2 shows the retrieval of the variable graphic objects from static PDF files.

Traditionally this process has been accomplished by RIPing (sending through a Raster Image Processor) each PDF file and using assembling hardware and/or software to overlay the raster images of each component to create a composite page. This construction is driven by a static, descriptive language, called a compositing language, that defines the appearance of each page in terms of component pages.

Because the RIP process can be computationally and time intensive, a technique is needed to organize a PDF file so that 1) multiple RIPs can be efficiently and simultaneously used to rasterize the file and 2) component PDF files that are used multiple times, i.e., composited more that once onto a single page or different pages, can share a single pass through the RIP and/or rasterization process.

SUMMARY OF INVENTION

A technique for creating a compressed form of Adobe® Acrobat® PDF from a stream of variable page descriptions and static PDF files is disclosed. The resulting compressed files are compatible with the Adobe® Acrobat® line of products. The technique includes a symmetrical compression/decompression process yielding a file in which composite pages and their components can be efficiently and directly accessed.

BRIEF DESCRIPTION OF DRAWINGS

FIG. 1b shows variable data being placed into the document of FIG. 1a.

DETAILED DESCRIPTION

Figure 1:
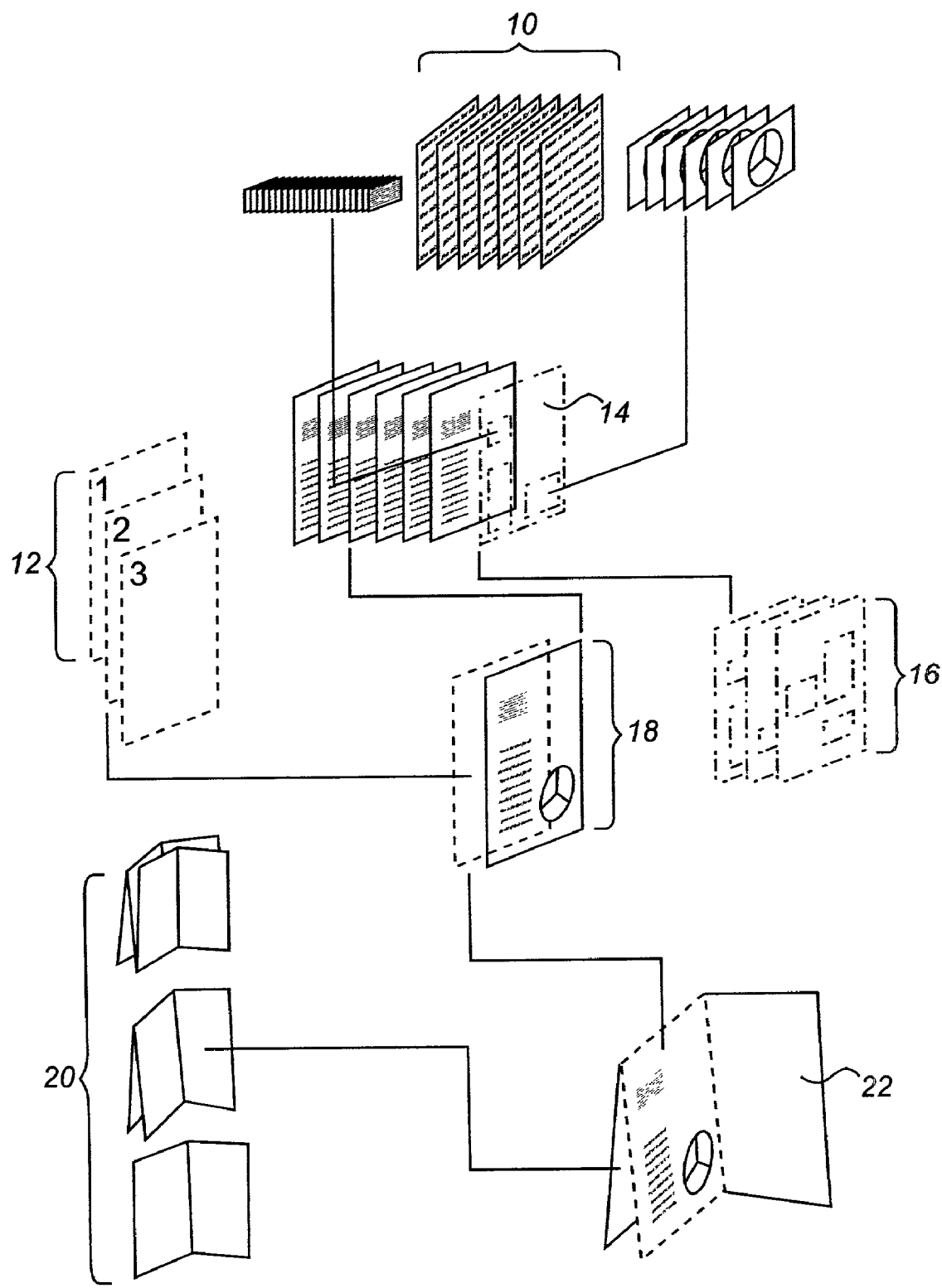
FIG. 1 shows how complex documents are assembled from multiple component PDF files.
Figure 1A:
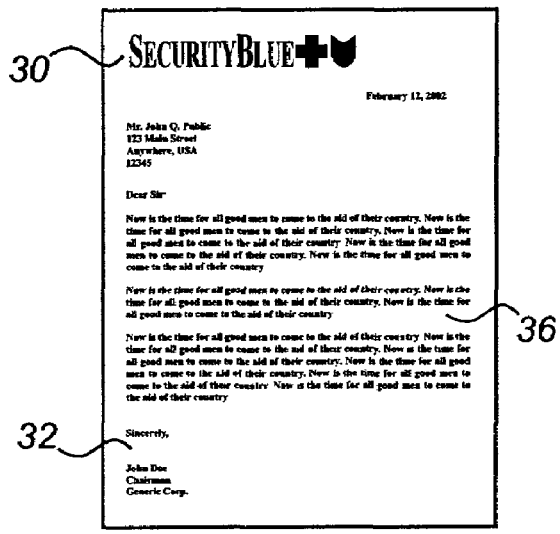
FIG. 1a shows a complex document having variable fields.
Figure 1B:
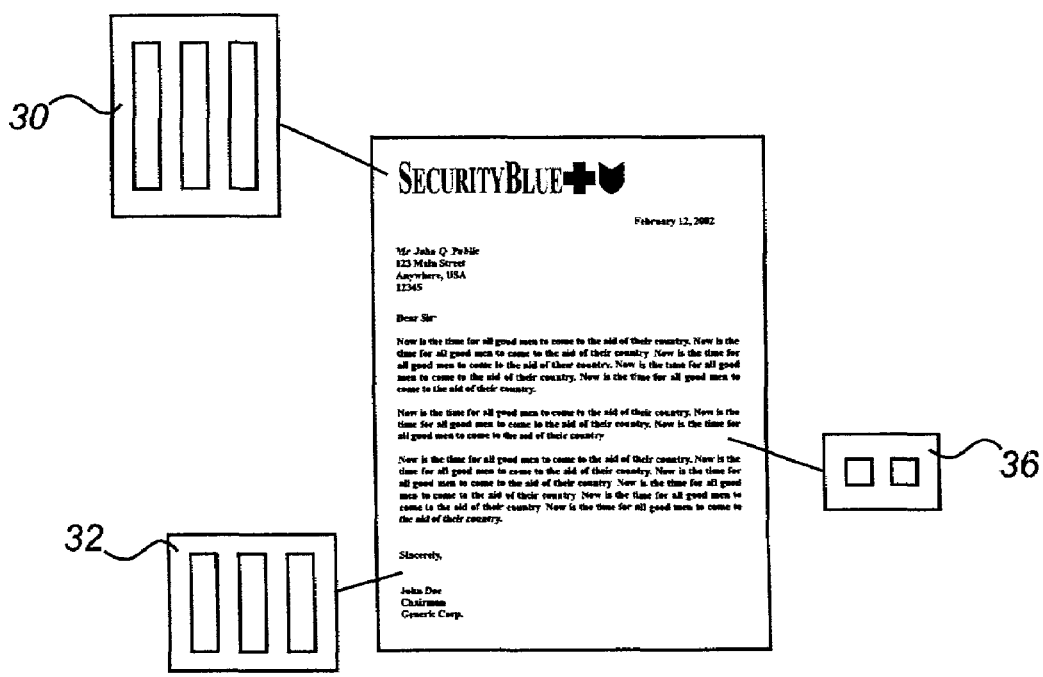
Figure 1C:
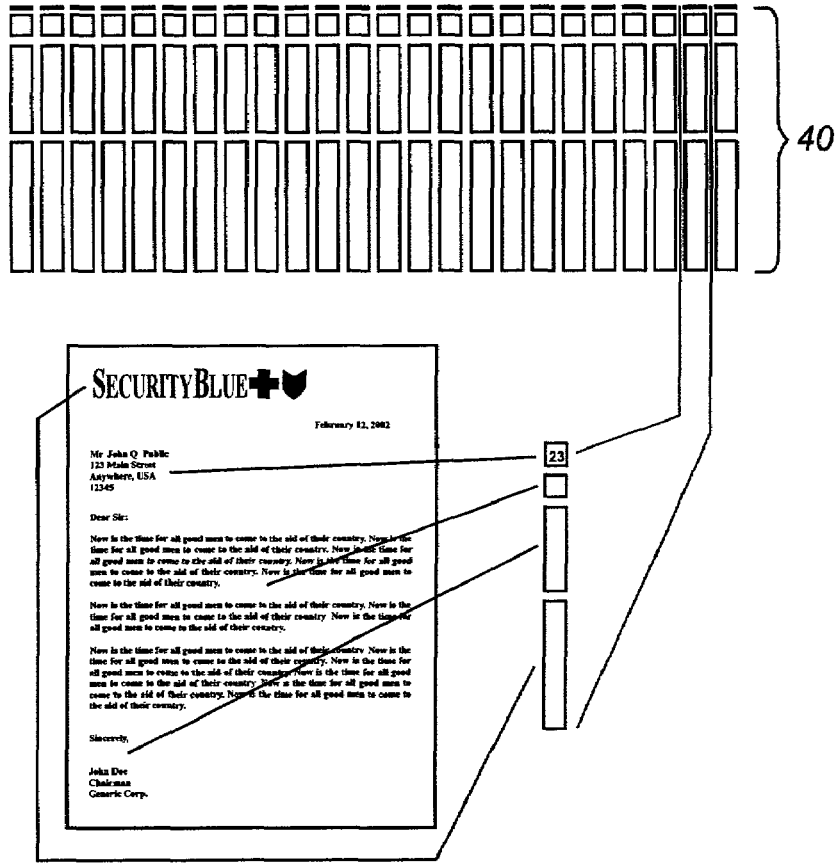
FIG. 1c shows the selection of components for the variable data fields based on a data stream.
Figure 1D:
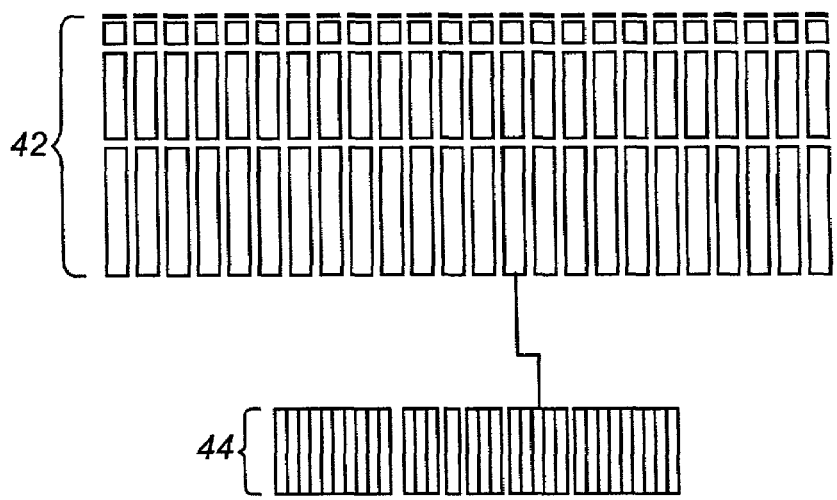
FIG. 1d shows the selection of components for the variable data fields from a PDF file.
Figure 2A:
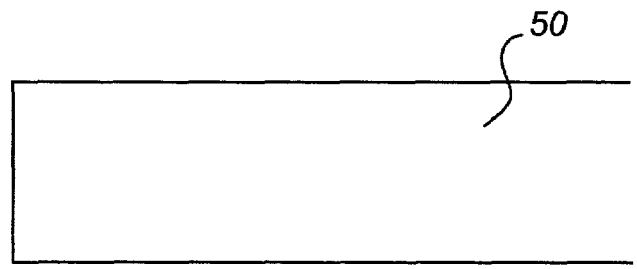
FIGS. 2a, 2b and 2c show the placement of Cos objects and allocated storage blocks in a compressed composite PDF file.
Figure 2B:
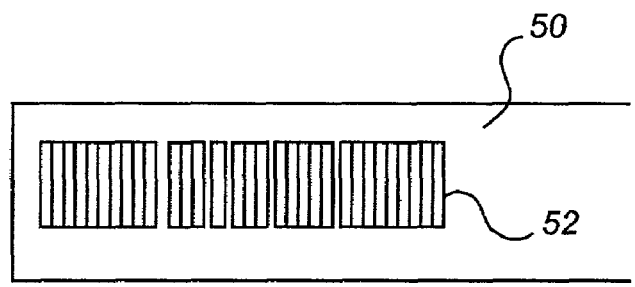
Figure 2C:
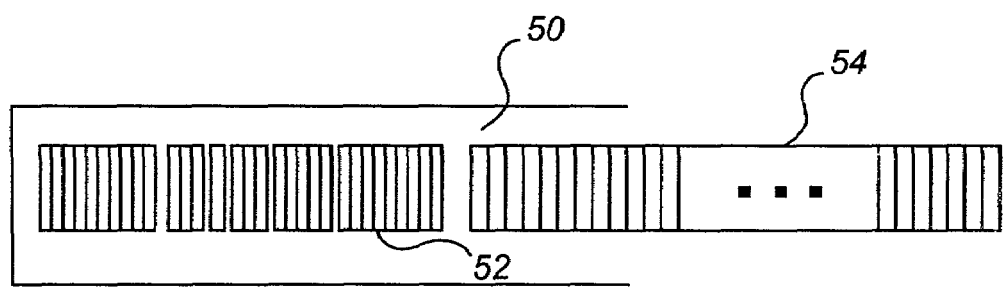

The following process describes the construction of multiple component static PDF files into a composite, compressed file which is compatible with the Adobe® Acrobat® line of products. Several assumptions are made regarding the static PDF source files. First, each component PDF page in a static source PDF file is modified at most by one clipping function and a single 2-dimensional matrix transformation (CTM or Current Transformation Matrix). The clipping function describes an area of the page which is to be eliminated from the composite (i.e., a hole in the page) such that other pages underlying the clipped page can show through. The matrix transformation is a mathematical function that rotates, scales or offsets an object. Second, each static PDF file has a contents array containing references to PDF commands and a resources dictionary that identifies all resources used on the page.

The process that describes the construction of each composite page is defined by a compositing language, several of which are well known in the art. Some examples include ASCII text, pdfExpress script, PPML and the Barco Book Ticket Language. Using one of these languages, each resulting composite page is described separately. Within the description of each composite page, every placement of a PDF page from a static PDF file is defined by its own CTM and clipping function. Further, on each composite page, the placement of a static page, using the clipping function and the CTM, overlays any prior marks caused by previous placements on the composite page. Using the compositing language, the composite page description can be parsed efficiently into a single, random access data structure representing the entire assembly process. The compositing language may also support other features, such as the substitution of text or images.

The compressed output composite PDF file is first defined by a sequence of operations, based on the compositing language, which are recorded for later analysis. The recording of the operations allows an analysis and optimization step to occur prior to the creation of the output file. The compression is a two-phased operation. In the first phase, components of the input PDF files needed in the composited output are analyzed. These components may need to be modified in some manner. In the second phase the components are copied, and any necessary modifications are applied.

Prior to the analysis, a sequence of operations that select and place PDF pages from existing static PDF files into new pages in the output PDF file is recorded in a data structure. Each new composite PDF page is defined by the following:
1. A base page size defined by a rectangle;
2. A base PDF rotation for the base page defining the orientation of that page (i.e., 0°, 90°, etc.); and
3. Zero or more additional PDF pages layered or overlaid on top of the base page. For each such page, a CTM and a clipping function is specified.

In phase I of the analysis, each input static PDF file is opened and the PDF pages within the files are located, using the root and tree-structure. For each page, the PDF resources (Cos objects) that are used on that page are identified and assigned a unique name. A resource lookup table is created to associate the unique name with the original name of the resource. Resources shared across two or more PDF pages are tracked separately for each page that references them. Next, the PDF content stream for each page is examined to determine all points where a PDF operator references a resource. The information required to modify the reference to the resource is stored. Lastly, certain information about the PDF component parts (i.e., PDF Cos objects and PDF content streams) of each page is stored in a second table associated with each PDF file and each page. This table defines a set of modifications to the input PDF files that allow the contents of the files to be used in the next phase.

Figure 3:
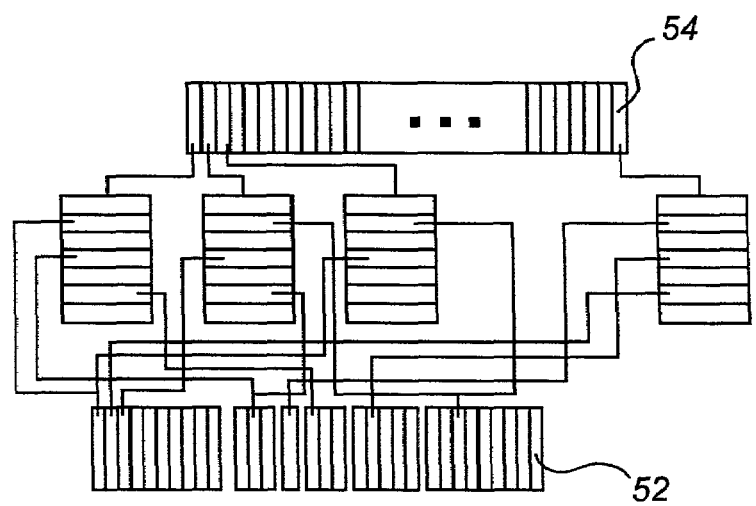
FIG. 3 shows the links between allocated storage blocks, contents arrays and Cos objects.

In phase II, the output file is constructed. First, an output file usage table is created which has an entry for each PDF component part (i.e., PDF content stream or PDF Cos object). Initially, all entries are set to FALSE, indicating that the component has not been copied to the output file. Next, the recorded operations are sequentially processed. When a reference to a particular PDF page is encountered within the recorded operations, the output file usage table is tested for each component part of the page. If a FALSE entry is encountered, the component part is copied to the output file and the table is set to TRUE. Conversely, if a TRUE entry is encountered, no copying is performed. The effect is to copy each PDF component part to the output file only one time. The copied PDF components are shown in FIG. 3B. As each object is copied to the output file, it is assigned a new ID number, such that a new numbering system is created only for objects copied to the output file. As PDF content streams are encountered, each operator is inspected. If a reference is made to an original PDF resource, a lookup is performed in the resource lookup table, and the operation is modified to refer to the resource using the new, unique name of the resource instead of the original name.

For each new output page, a new PDF content stream is created to represent the page. Preferably, the new content stream is constructed as a Cos array type object (Contents Array), but other representations are possible. In the output file, a static block of storage is allocated for each new output page. This is shown in FIG. 3(C). The storage block links resources and the Contents Array for each page. The Contents Array is populated with references to the Cos objects using the IDs that were assigned when the objects were copied to the output file.

For each static PDF page to be composited onto a new output page, the following occurs: A PDF stream consisting of commands which terminate and initiate graphic isolation, transform and crop the static PDF page, and identify the page is constructed. The page identification consists of the following information: a platform independent path and file name, the original page number, the total number of pages in the original file, a unique checksum dependent on the content streams representing the page, the clipping function, the CTM, and the number of times this file/page combination is used (defined as use count). This stream is converted to a Cos object and inserted in the next available Contents Array slot. The Contents Array elements for the page are then copied into the array and the next available slot is advanced to the first available slot after the copied contents. Finally, as shown in FIG. 4, the Contents Array is written to the output file, along with the information necessary to reference the proper resources required for that page.

In alternative embodiments, un-referenced static PDF pages and un-used Cos objects, as well as the text of the original compositing language, may be stored in the PDF files as storage blocks for purposes of reconstruction if the file is to be decompressed.

The compressed file can be decompressed in a reverse process. The compressed composite PDF is opened and a traversal of all of the Contents Array for each of the composite PDF pages in the file, as well as the list of unused static PDF pages is completed. All references to the original, static PDF pages are collected and sorted by file name and page number, and duplicate entries are removed. During the traversal a compositing language stream is constructed based on the file names, page numbers, CTMs, clipping functions and composite page structure. This language duplicates the original used to construct the file. Alternatively, the original language could be extracted if stored as described above.

The list is processed by file name. The PDF files are constructed using the page components identified in the traversal described above.

Random access to page information is driven by the PDF page structure. For a given page, the PDF page structure is traversed to locate the page. This yields approximately Log(n) performance for accessing pages (where n is the number of pages) because the PDF Page structure acts as a database-style index to the given pages.

Because the PDF file represents the entire set of knowledge required for a complete, set-theoretic job decomposition of itself, the RIPing process can make a complete, static analysis of the file. This static analysis can be used to efficiently process the file, and the process can be optimized based on the particular production environment (i.e., output device).

It can be seen that various modifications could be made to the above-described process without deviating from the spirit or scope of the invention, which is embodied in the claims below. For example, the content copying pass and page construction pass could be combined into a single pass.

The invention claimed is:

1. A method for creating a compressed PDF file containing one or more composite PDF pages comprising the steps of:
   parsing a description of each of said composite pages and storing said parsed description;
   opening one or more input PDF files and uniquely identifying Cos objects used by PDF pages defined by PDF content streams within said one or more input PDF files;
   copying said Cos objects required by said composite pages to an output file, and eliminating duplicate Cos objects, such that each unique Cos object is copied to said output file only once;
   creating a PDF content stream for said one or more composite graphic pages, based on said stored description, which includes references to said Cos objects in said output file; and
   copying said PDF content stream of said one or more composite graphic pages to said output file.

2. The method of claim 1 wherein said description of said composite pages are in the form of a compositing language.

3. The method of claim 2 wherein said compositing language is selected from a group comprising ASCII text, pdfExpress script, PPML and the Barco Book Ticket Language.

4. The method of claim 1 further comprising the step of copying Cos objects unused by said one or more composite graphic pages to said output file.

5. The method of claim 2 further comprising the step of copying said compositing language describing each of said composite pages to said output file.

6. The method of claim 1 further comprising the step of assigning unique identifiers to said Cos objects as they are copied to said output file.

7. The method of claim 6 wherein said PDF content stream for said one or more composite graphic pages is constructed as a Cos array-type object.

8. The method of claim 7 wherein said Cos array-type objects containing said PDF content streams reference said copied Cos objects using said unique identifiers.

9. The method of claim 1 further wherein said composite graphic pages comprise a base page and zero or more overlaid pages.

10. The method of claim 9 wherein a PDF rotation is applied to said base page.

11. The method of claim 10 wherein said zero or more overlaid pages are modified by a clipping function.

12. The method of claim 10 wherein said zero or more overlaid pages are modified by a two-dimensional matrix transformation.

13. The method of claim 10 wherein said zero or more overlaid pages are modified by a clipping function and a two-dimensional matrix transformation.

14. The method of claim 13 wherein said clipping function and said two-dimensional matrix are copied to said output file as part of said PDF content stream for said one or more composite graphic pages.

* * * * *